(12) United States Patent
Nishio et al.

(10) Patent No.: US 9,018,637 B2
(45) Date of Patent: Apr. 28, 2015

(54) TRANSISTOR AND METHOD FOR MANUFACTURING SAME

(71) Applicant: Kabushiki Kaisha Toshiba, Tokyo (JP)

(72) Inventors: Johji Nishio, Tokyo (JP); Hiroshi Kono, Hyogo-ken (JP); Takuma Suzuki, Hyogo-ken (JP); Tatsuo Shimizu, Tokyo (JP); Takashi Shinohe, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/799,596

(22) Filed: Mar. 13, 2013

(65) Prior Publication Data
US 2014/0034966 A1 Feb. 6, 2014

(30) Foreign Application Priority Data

Jul. 31, 2012 (JP) ................................. 2012-170281

(51) Int. Cl.
| | | |
|---|---|---|
| H01L 31/0312 | (2006.01) | |
| H01L 29/16 | (2006.01) | |
| H01L 29/66 | (2006.01) | |
| H01L 29/739 | (2006.01) | |

(Continued)

(52) U.S. Cl.
CPC ...... *H01L 29/1608* (2013.01); *H01L 29/66068* (2013.01); *H01L 29/7395* (2013.01); *H01L 29/7802* (2013.01); *H01L 29/045* (2013.01); *H01L 29/0878* (2013.01); *H01L 29/1095* (2013.01); *H01L 29/161* (2013.01)

(58) Field of Classification Search
USPC .......................................... 257/328–334, 77
See application file for complete search history.

(56) References Cited

U.S. PATENT DOCUMENTS

| | | | | |
|---|---|---|---|---|
| 6,165,874 | A * | 12/2000 | Powell et al. ................. | 438/478 |
| 6,297,100 | B1 | 10/2001 | Kumar et al. | |

(Continued)

FOREIGN PATENT DOCUMENTS

| | | |
|---|---|---|
| JP | 2001-77363 | 3/2001 |
| JP | 2007-103564 | 4/2007 |

(Continued)

OTHER PUBLICATIONS

Japanese Office Action issued Jun. 6, 2014, in Japan Patent Application No. 2012-170281 (with English translation).

(Continued)

*Primary Examiner* — Thien F Tran
(74) *Attorney, Agent, or Firm* — Oblon, McClelland, Maier & Neustadt, L.L.P.

(57) ABSTRACT

According to one embodiment, a transistor includes: a structural body; an insulating film; a control electrode; a first electrode; and a second electrode. The structural body includes a first through a third semiconductor regions, and includes a compound semiconductor having a first and a second elements. The first electrode is electrically continuous with the third semiconductor region. The second electrode is electrically continuous with the first semiconductor region. The structural body has a first region provided above a lower end of the second semiconductor region and a second region other than the first region. The first region is a region formed by making a ratio of concentration of source gas of the second element to concentration of source gas of the first element larger than 1.0. Impurity concentration of the first conductivity type in the first region is higher than that in the second region.

13 Claims, 5 Drawing Sheets

(51) Int. Cl.
*H01L 29/78* (2006.01)
*H01L 29/08* (2006.01)
*H01L 29/10* (2006.01)
*H01L 29/161* (2006.01)
*H01L 29/04* (2006.01)

(56) References Cited

U.S. PATENT DOCUMENTS 8,569,106 B2 * 10/2013 Hamano et al. ............... 438/105

2012/0244307 A1 * 9/2012 Hori et al. ...................... 428/56

FOREIGN PATENT DOCUMENTS

JP   2009-182240   8/2009
JP   2011-165861   8/2011

OTHER PUBLICATIONS

Office Action issued Feb. 2, 2015 in Japanese Patent Application No. 2012-170281 (with English translation).

* cited by examiner

TRANSISTOR AND METHOD FOR MANUFACTURING SAME

CROSS-REFERENCE TO RELATED APPLICATIONS

This application is based upon and claims the benefit of priority from the prior Japanese Patent Application No. 2012-170281, filed on Jul. 31, 2012; the entire contents of which are incorporated herein by reference.

FIELD

Embodiments described herein relate generally to a transistor and a method for manufacturing same.

BACKGROUND

In transistors, it is important to reduce the on-resistance and to increase the breakdown voltage. In a transistor based on compound semiconductor, the device is miniaturized to reduce the on-resistance. On the other hand, device miniaturization is likely to incur the decrease of breakdown voltage. To ensure the breakdown voltage, the impurity concentration in the pn junction portion is adjusted. However, impurity implantation for the adjustment may decrease the channel mobility. This incurs characteristics degradation such as the decrease of switching speed. In transistors, improvement and stabilization of the characteristics are desired.

DETAILED DESCRIPTION

Figure 1:
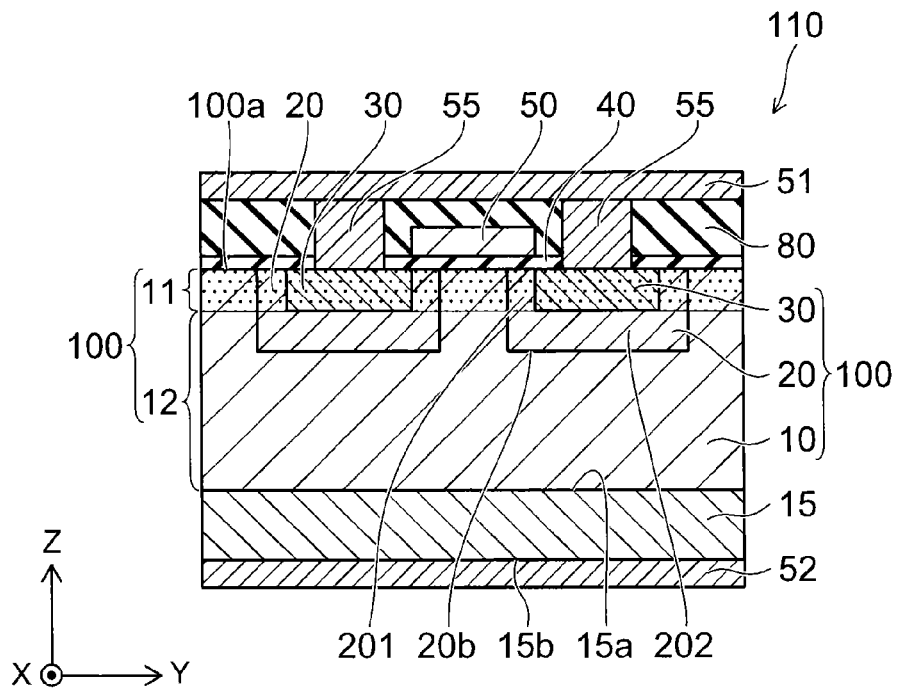
FIG. 1 is a schematic sectional view illustrating the configuration of a transistor according to a first embodiment.

In general, according to one embodiment, a transistor includes: a structural body including a first semiconductor region of a first conductivity type, a second semiconductor region of a second conductivity type provided on the first semiconductor region, and a third semiconductor region of the first conductivity type provided on the second semiconductor region, the structural body including a compound semiconductor having a first element and a second element; an insulating film provided on the second semiconductor region; a control electrode provided on the insulating film; a first electrode electrically continuous with the third semiconductor region; and a second electrode electrically continuous with the first semiconductor region. The structural body has a first region provided above a lower end of the second semiconductor region and a second region other than the first region The first region is a region formed by making a ratio of concentration of source gas of the second element to concentration of source gas of the first element larger than 1.0. Impurity concentration of the first conductivity type in the first region is higher than impurity concentration of the first conductivity type in the second region.

In general, according to another embodiment, a method for manufacturing a transistor is provided. The method includes: forming a first semiconductor region of a first conductivity type having a second region and a first region provided on the second region, the first semiconductor region including a compound semiconductor having a first element and a second element; forming a second semiconductor region of a second conductivity type deeper than a lower end of the first region by implanting impurity of the second conductivity type partly into the first semiconductor region; forming a third semiconductor region of the first conductivity type by implanting impurity of the first conductivity type partly into the second semiconductor region; forming a control electrode via the insulating film above the second semiconductor region; forming a first electrode electrically continuous with the third semiconductor region; and forming a second electrode electrically continuous with the first semiconductor region. The forming a first semiconductor region includes making impurity concentration of the first conductivity type in the first region higher than impurity concentration of the first conductivity type in the second region, and making concentration of vacancies of the first element in the first region higher than concentration of vacancies of the first element in the second region.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

In the following description, by way of example, the first conductivity type is n-type, and the second conductivity type is p-type.

In the following description, the notations of $n^+$, $n$, $n^-$ and $p^+$, $p$, $p^-$ represent relative magnitude of impurity concentration in each conductivity type. That is, $n^+$ represents relatively higher n-type impurity concentration than $n$, and $n^-$ represents relatively lower n-type impurity concentration than $n$. Similarly, $p^+$ represents relatively higher p-type impurity concentration than $p$, and $p^-$ represents relatively lower p-type impurity concentration than $p$.

(First Embodiment)

FIG. 1 is a schematic sectional view illustrating the configuration of a transistor according to a first embodiment.

As shown in FIG. 1, the transistor 110 according to the first embodiment includes a structural body 100, a gate insulating film 40 (insulating film), a gate electrode 50 (control electrode), a source electrode 51 (first electrode), and a drain electrode 52 (second electrode). The transistor 110 is e.g. a MOSFET (metal oxide semiconductor field effect transistor).

The structural body 100 includes an $n^-$-type drift region 10 (first semiconductor region), a p-type base region 20 (second semiconductor region), and an $n^+$-type source region 30 (third semiconductor region). The structural body 100 includes a compound semiconductor having a first element and a second element. This embodiment is described with reference to an example of using silicon carbide (SiC) having silicon (Si) as the first element and carbon (C) as the second element.

The drift region 10 is provided on a first surface 15a of a substrate 15 including e.g. $n^+$-type SiC. In this embodiment, the direction connecting the substrate 15 and the drift region 10 is referred to as Z direction (first direction). A direction orthogonal to the Z direction is referred to as Y direction (second direction). The direction orthogonal to the Z direction and the Y direction is referred to as X direction (third direction). Furthermore, the direction from the substrate 15 toward the drift region 10 is referred to by using "on" or "above" (upper side), and the opposite direction is referred to by using "below" (lower side).

The drift region 10 is formed on the first surface 15a of the substrate 15 by e.g. epitaxial growth. The thickness (length in the Z direction) of the drift region 10 is set based on e.g. the specification of the breakdown voltage of the transistor 110.

The base region 20 is provided on the drift region 10. The base region 20 is provided on part of the upper side of the drift region 10. The base region 20 is a p-well region provided to a prescribed depth from the upper surface of the drift region 10. The base region 20 extends in e.g. the X direction. The base region 20 may be provided in a plurality. The plurality of base regions 20 are spaced from each other in the Y direction. The plurality of base regions 20 are arranged with a prescribed spacing in the Y direction.

The source region 30 is provided on the base region 20. The source region 30 is provided on part of the upper side of the base region 20. The source region 30 extends in e.g. the X direction. The source region 30 is spaced from the drift region 10 in the Y direction. That is, on the upper surface 100a side of the structural body 100, the drift region 10, the base region 20, and the source region 30 are arranged in the Y direction. On the upper side of the structural body 100, the base region 20 provided between the drift region 10 and the source region 30 constitutes a channel region.

Here, the depth and impurity concentration of each portion are described.

The thickness of the substrate 15 is e.g. approximately 350 micrometers (μm). The impurity concentration of the substrate 15 is e.g. approximately $5 \times 10^{18}$ cm$^{-3}$.

The thickness of the drift region 10 is e.g. 5 μm or more and 15 μm or less. The impurity concentration of the drift region 10 is e.g. $5 \times 10^{15}$ cm$^{-3}$ or more and $2 \times 10^{16}$ cm$^{-3}$ or less. To support higher breakdown voltage, the thickness of the drift region 10 is e.g. 5 μm or more and 50 μm or less, and the impurity concentration of the drift region 10 is e.g. $5 \times 10^{14}$ cm$^{-3}$ or more and $1 \times 10^{16}$ cm$^{-3}$ or less. Thus, a MOSFET having a breakdown voltage from several hundred volts (V) to 6500 V or more is realized.

The thickness of the base region 20 is e.g. 0.5 μm or more and 1.5 μm or less. The impurity concentration of the base region 20 is e.g. $1 \times 10^{17}$ cm$^{-3}$ or more and $5 \times 10^{18}$ cm$^{-3}$ or less. The impurity concentration of the base region 20 is increased with the distance in the Z direction from the upper surface 100a of the structural body 100. The impurity concentration of the base region 20 is maximized at the deepest position (lower end 20b side) of the base region 20.

The thickness of the source region 30 is e.g. 0.1 μm or more and 0.3 μm or less. Depending on the thickness of the base region 20, the thickness of the source region 30 is e.g. 0.1 μm or more and 0.5 μm or less. The impurity concentration of the source region 30 is e.g. $5 \times 10^{18}$ cm$^{-3}$ or more and $5 \times 10^{20}$ cm$^{-3}$ or less.

The gate insulating film 40 is provided on the base region 20. In this embodiment, the gate insulating film 40 is in contact with the upper surface 100a of the structural body 100. The gate insulating film 40 is made of e.g. silicon oxide, silicon nitride, or high dielectric material (high-k material).

The gate electrode 50 is provided on the gate insulating film 40. The gate electrode 50 is made of e.g. polycrystalline silicon or metal material (such as TiN, Al, Ru, W, and TaSiN).

The source electrode 51 is electrically continuous with the source region 30. The source electrode 51 is provided via an interlayer insulating film 80 above the structural body 100.

The source electrode 51 is insulated from the gate electrode 50 by the interlayer insulating film 80. The source electrode 51 is connected to the source region 30 via a contact 55 penetrating through the interlayer insulating film 80 and the gate insulating film 40. The source electrode 51 is made of e.g. metal material (such as Al).

The drain electrode 52 is electrically continuous with the drift region 10. The drain electrode 52 is in contact with a second surface 15b of the substrate 15 on the opposite side from the first surface 15a. The drain electrode 52 is electrically continuous with the drift region 10 via the substrate 15. The drain electrode 52 is made of e.g. metal material (such as Al).

Here, the operation of the transistor 110 is described.

A positive voltage relative to the source electrode 51 is applied to the drain electrode 52. In this state, a voltage more than or equal to the threshold is applied to the gate electrode 50. Then, an inversion layer (channel) is formed near the interface of the base region 20 with the gate insulating film 40. Thus, the transistor 110 is turned on, and a current flows from the drain electrode 52 to the source electrode 51.

On the other hand, if the voltage applied to the gate electrode 50 is less than the threshold, the channel vanishes. Thus, the transistor 110 is turned off, and the current flowing from the drain electrode 52 to the source electrode 51 is blocked.

In such a transistor 110, the structural body 100 has a first region 11 provided above the lower end 20b of the base region 20, and a second region 12 other than the first region 11. The n-type impurity concentration in the first region 11 is higher than the n-type impurity concentration in the second region 12. For instance, in the case of using nitrogen (N) as n-type impurity, the concentration of N in the first region 11 is higher than the concentration of N in the second region 12. Thus, in the case where the conductivity type of the region overlapping the second region 12 in the drift region 10 is n$^-$-type, the conductivity type of the region overlapping the first region 11 in the drift region 10 is n-type.

Furthermore, the first region 11 is a region formed by making the ratio of the concentration of the source gas of C to the concentration of the source gas of Si (hereinafter referred to as "C/Si ratio") larger than 1.0. The concentration of vacancies of Si in the first region 11 is considered to be higher than the concentration of vacancies of Si in the second region 12. Here, in this embodiment, the vacancy of Si includes not only the lattice point in the SiC matrix lacking the atom, but also the lattice point in the SiC matrix where the Si atom is replaced by another atom.

The drift region 10 is formed by continuous epitaxial growth from the second region 12 to the first region 11. In this case, the concentration of C in the epitaxial growth of the first region 11 is made higher than the concentration of C in the epitaxial growth of the second region 12. Thus, the concentration of C of the first region 11 is made higher than the concentration of C of the second region 12. It is considered that in the first region 11, because the concentration of C is made higher, the concentration of vacancies of Si present in the crystal lattice of SiC is made higher than in the second region 12. Furthermore, it is considered that in the first region 11, the concentration of vacancies of C present in the crystal lattice of SiC is made lower than in the second region 12.

In the transistor 110 having such a first region 11, the carrier density of the region 201 of the base region 20 overlapping the first region 11 is made lower than the carrier density of the region 202 of the base region 20 overlapping the second region 12.

That is, in the first region 11, the n-type impurity concentration is higher than in the second region 12. Thus, when p-type impurity (e.g., aluminum (Al)) is implanted in forming the base region 20, more p-type impurity is compensated by n-type impurity (e.g., N) in the region 201 than in the region 202. Accordingly, the carrier density of the region 201 is made lower than the carrier density of the region 202.

The p-type impurity (e.g., Al) implanted in forming the base region 20 is scarcely compensated in the region 202. Thus, the impurity concentration in the deep region of the base region 20 is increased, and this region is made difficult to be depleted. In the pn junction region between the lower end 20b of the base region 20 and the drift region 10, if the base region 20 side is made difficult to be depleted, the drift region 10 side is made easy to be depleted. Thus, the voltage breakdown is made less likely to occur. This increases the breakdown voltage of the transistor 110.

The first region 11 is a carbon-rich region in SiC. When p-type impurity (e.g., Al) is implanted into this first region 11, excess Al is likely to react with vacancies of Si. Thus, the density of interstitial impurity atoms due to excess Al is decreased. The decrease of interstitial impurity atoms in the channel region reduces Coulomb scattering factors decreasing the channel mobility, and hence suppresses characteristics degradation. Thus, the channel region included in the region 201 is scarcely affected by the implantation of p-type impurity. Furthermore, the decrease of the concentration of vacancies of C in the first region 11 reduces density of interface levels. Thus, increase in mobility is expected.

Here, in the case of forming the base region 20 by implanting impurity into the drift region 10 not provided with the first region 11, if the concentration of impurity implanted to increase the breakdown voltage is increased, the impurity concentration on the surface side of the base region 20 is also increased accordingly. Because a channel is formed on the surface side of the base region 20, the increase of impurity concentration incurs variation in threshold voltage.

On the other hand, it is also considered to adjust the variation of threshold voltage by counter ion implantation of n-type impurity into the surface side of the base region 20 where the p-type impurity concentration is increased. However, damage to the channel portion is increased by counter ion implantation. This may increase the on-resistance due to the decrease of channel mobility.

In the transistor 110 according to this embodiment, in implanting impurity into the base region 20, the impurity concentration in the deep region of the base region 20 is increase while suppressing the influence of the impurity on the channel region. Thus, the breakdown voltage is increased. That is, the transistor 110 achieves compatibility between the suppression of the influence on the channel region and the increase of breakdown voltage.

Figures 2A, 2B, 2C:
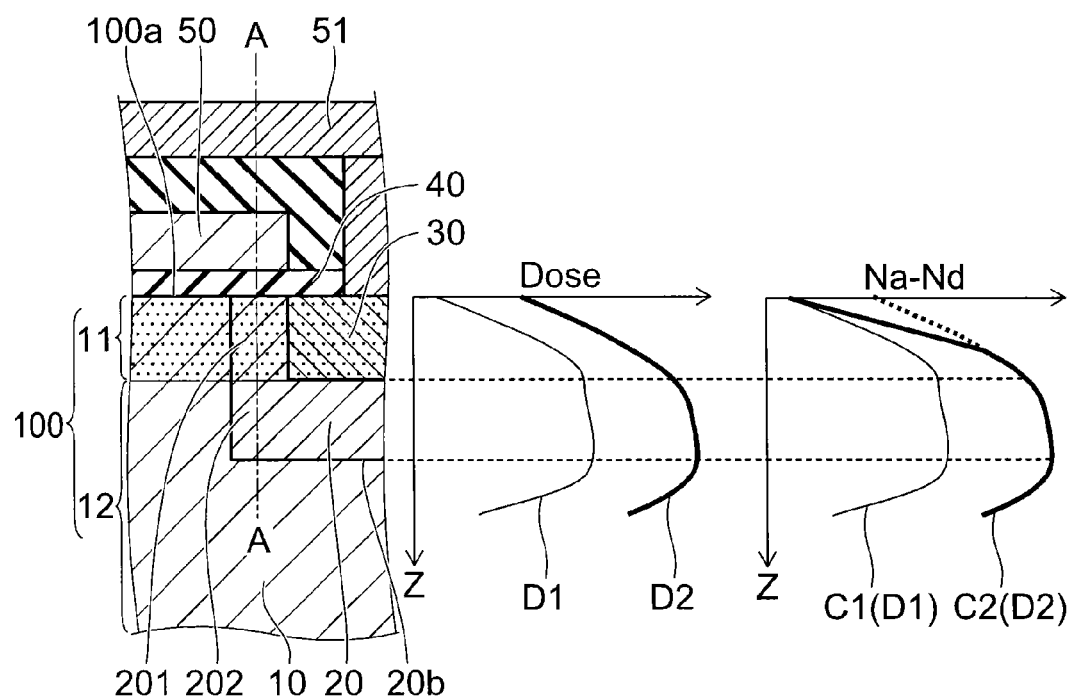
FIGS. 2A to 2C illustrate a base region.

FIGS. 2A to 2C illustrate the base region.

FIG. 2A shows a schematic sectional view of the base region and its surroundings. FIG. 2B shows the dose amount of impurity with respect to the Z direction along line A-A shown in FIG. 2A. FIG. 2C shows the carrier density with respect to the Z direction along line A-A shown in FIG. 2A.

As shown in FIG. 2A, the drift region 10 includes a first region 11 provided above the lower end 20b of the base region 20, and a second region 12 other than the first region 11. FIG. 2B shows the dose amount with respect to the Z direction in the case where the dose amount is increased from D1 to D2. For each of the dose amounts D1 and D2, the dose amount of p-type impurity (e.g., Al) in forming the base region 20 is set to be maximized at the lower end 20b of the base region 20. When the dose amount is increased from D1 to D2, the trend of the variation of the dose amount with respect to the Z direction is not significantly changed, but only the absolute dose amount is increased.

FIG. 2C shows the carrier densities C1 and C2 in the case of implanting p-type impurity (e.g., Al) with the dose amounts D1 and D2 shown in FIG. 2B. Regarding the carrier density, when the dose amount is increased from D1 to D2, in the region 202 of the base region 20 overlapping the second region 12, the acceptor density Na is increased with the increase of the dose amount and leads to the increase of carrier density.

On the other hand, in the region 201 of the base region 20 overlapping the first region 11, the implanted p-type impurity (e.g., Al) reacts with vacancies of Si. Thus, despite the increase of dose amount, the acceptor density Na is not significantly increased. Here, the dotted line shown in FIG. 2C represents the carrier density in the case where the first region 11 is not provided. It is found that the increase of carrier density is suppressed by the provision of the first region 11.

The increase of acceptor density Na is suppressed more significantly toward the upper side of the region 201. The upper side of the region 201 is close to the interface with the gate insulating film 40, and is one of the important regions determining the function of the channel. Thus, despite the increase of dose amount from D1 to D2, the increase of carrier density of the region 201 is suppressed, and the increase of carrier density of the region 202 is achieved.

That is, in the transistor 110 according to this embodiment, despite the increase of dose amount in forming the base region 20, the increase of carrier density of the channel region is suppressed, and the variation of threshold voltage is suppressed. Furthermore, by increasing the dose amount in forming the base region 20, the carrier density at the deep position of the base region 20 is increased. This increases the breakdown voltage in the pn junction portion.

Here, the thickness of the first region 11 is smaller than the thickness of the base region 20, and preferably half or less of the thickness of the base region 20. This is because the portion important for the function of the channel in the base region 20 is approximately half or less of the thickness of the base region 20. Thus, in the case where the thickness of the base region 20 is approximately 0.6 μm, the thickness of the first region 11 is smaller than 0.6 μm, preferably 0.5 μm or less, and more preferably 0.3 μm or less.

The thickness of the first region 11 is preferably made thicker than the thickness of step bunching occurring in the epitaxial growth of the drift region 10. Step bunching refers to the step difference occurring at the surface of the layer epitaxially grown on the substrate 15 in the case of using an off-cut substrate (such as 2 degrees off, 4 degrees off, and 8 degrees off) as the substrate 15.

In the case where step bunching occurs, part of the surface of the drift region 10 is preferably removed by e.g. CMP (chemical mechanical polishing) to remove step bunching for planarization. Thus, the thickness of the first region 11 is preferably made thicker than the thickness of step bunching so that the first region 11 remains even if the step bunching is removed.

The surface of the structural body 100 on the gate insulating film 40 side (upper surface 100a) is e.g. a (0001) surface (Si surface) of hexagonal SiC. In this embodiment, it is assumed that the crystal surface referred to includes not only the particular crystal surface but also a surface misoriented by the angle of the off-cut substrate with respect to that crystal surface.

The upper surface 100a of the structural body 100 may be a (000-1) surface (C surface) of hexagonal SiC. If the upper surface 100a is a (000-1) surface (C surface) of SiC, the range capable of specular growth is larger than on the Si surface. Thus, in the case of performing the same specular growth, the growth rate is faster than on the Si surface. Furthermore, in the crystal growth using a (000-1) surface (C surface), step bunching is less likely to occur. This eliminates the need of polishing such as CMP after epitaxial growth, or makes the amount of polishing smaller than in the case of using a Si surface.

(Second Embodiment)

Next, a second embodiment is described. The second embodiment relates to an example of the method for manufacturing the transistor 110.

Figure 3:
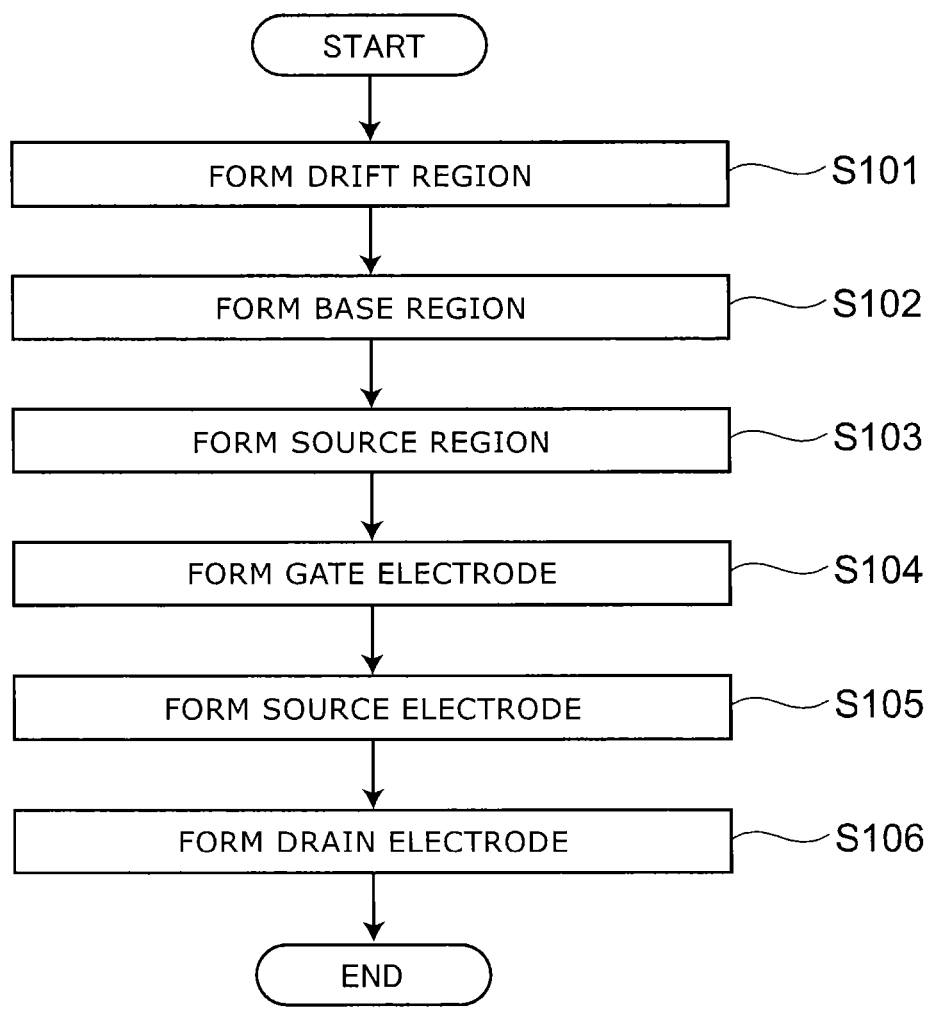
FIG. 3 is a flow chart illustrating a method for manufacturing a transistor.

FIG. 3 is a flow chart illustrating the method for manufacturing a transistor.

As shown in FIG. 3, the method for manufacturing the transistor 110 according to this embodiment includes forming a drift region 10 (step S101), forming a base region 20 (step S102), forming a source region 30 (step S103), forming a gate electrode 50 (step S104), forming a source electrode 51 (step S105), and forming a drain electrode 52 (step S106). The formation of the drain electrode 52 may be performed at any point in steps S101-S105.

Next, a specific example of the method for manufacturing the transistor 110 is described.

FIGS. 4A to 6B are schematic sectional views showing the specific example of the method for manufacturing a transistor.

Figure 4A:
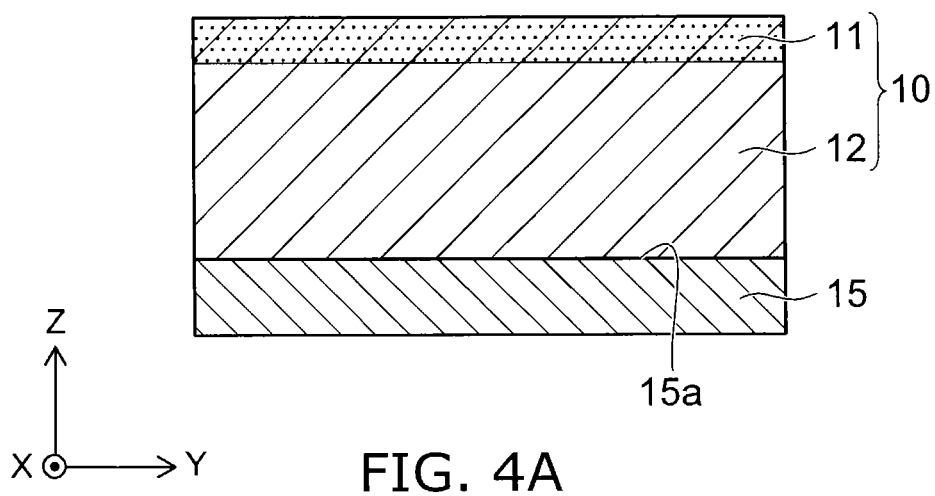
FIGS. 4A to 6B are schematic sectional views showing a specific example of the method for manufacturing a transistor.

First, as shown in FIG. 4A, a substrate 15 including SiC is prepared. The first surface 15a of the substrate 15 is e.g. a (0001) surface (Si surface) of hexagonal SiC. Alternatively, the first surface 15a may be e.g. a (000-1) surface (C surface) of hexagonal SiC. The substrate 15 contains phosphorus (P) or N as n-type impurity at an impurity concentration of approximately $5 \times 10^{18}$ cm$^{-3}$, and has a thickness of e.g. 350 μm.

Next, on the first surface 15a of the substrate 15, a drift region 10 is formed by epitaxial growth. The drift region 10 is formed by continuous epitaxial growth of a first region 11 on a second region 12. In forming the drift region 10, the second region 12 and the first region 11 are formed by adjusting the balance of the source gas in the epitaxial growth.

For instance, in the epitaxial growth of the drift region 10, monosilane (SiH$_4$) is used as the source gas of Si, and propane (C$_3$H$_8$) is used as the source gas of C. In the epitaxial growth of the second region 12, the ratio of the gas flow rate of C$_3$H$_8$ to the gas flow rate of SiH$_4$ (hereinafter referred to as C/Si ratio) is set to 1.0. On the other hand, in the epitaxial growth of the first region 11, the C/Si ratio is made larger than 1.0. For instance, the C/Si ratio in the epitaxial growth of the first region 11 is set to larger than 1.0 and 2.0 or less, and preferably 1.4 or more and 1.6 or less. Thus, the concentration of vacancies of Si in the first region 11 is made higher than the concentration of vacancies of Si in the second region 12.

The drift region 10 is formed to a thickness of e.g. 5 μm or more and 15 μm or less. To support higher breakdown voltage, the drift region 10 is formed to a thickness of e.g. 5 μm or more and 50 μm or less. The thickness of the first region 11 of the drift region 10 is smaller than the thickness of the base region 20, and preferably half or less of the thickness of the base region 20. In the case where the thickness of the base region 20 is approximately 0.6 μm, the thickness of the first region 11 is smaller than 0.6 μm, preferably 0.5 μm or less, and more preferably 0.3 μm or less.

In the epitaxial growth of the drift region 10, n-type impurity (e.g., N$_2$) is introduced along with the source gas. The impurity concentration of the second region 12 is e.g. $5 \times 10^{15}$ cm$^{-3}$ or more and $2 \times 10^{16}$ cm$^{-3}$ or less. In the case where higher breakdown voltage is required, the impurity concentration of the second region 12 is e.g. $5 \times 10^{14}$ cm$^{-3}$ or more and $1 \times 10^{16}$ cm$^{-3}$ or less.

The impurity concentration of the first region 11 is e.g. approximately twice or more and three times or less of the impurity concentration of the second region 12 ($5 \times 10^{15}$ cm$^{-3}$ or more and $2 \times 10^{16}$ cm$^{-3}$). In the case where higher breakdown voltage is required, the impurity concentration of the first region 11 is e.g. approximately twice or more and three times or less of the impurity concentration of the second region 12 ($5 \times 10^{14}$ cm$^{-3}$ or more and $1 \times 10^{16}$ cm$^{-3}$ or less). In switching from the epitaxial growth of the second region 12 to the epitaxial growth of the first region 11, the balance of the source gas is changed, and the amount of introduced n-type impurity is also changed if necessary. Thus, a C-rich first region 11 having high n-type impurity concentration is formed at the outermost surface of the drift region 10.

Here, the growth rate in the epitaxial growth of the first region 11 may be made lower than the growth rate in the epitaxial growth of the second region 12. Then, the first region 11 is grown with a nearly specular surface even if the C/Si ratio exceeds 1.0.

After forming the drift region 10, the surface may be polished by e.g. CMP. For instance, in the case where step bunching occurs at the surface of the drift region 10, polishing for removing this step bunching is performed. In the case of polishing the surface of the drift region 10, the thickness of the first region 11 is previously made thicker than the thickness of polishing of the surface of the drift region 10.

Figure 4B:
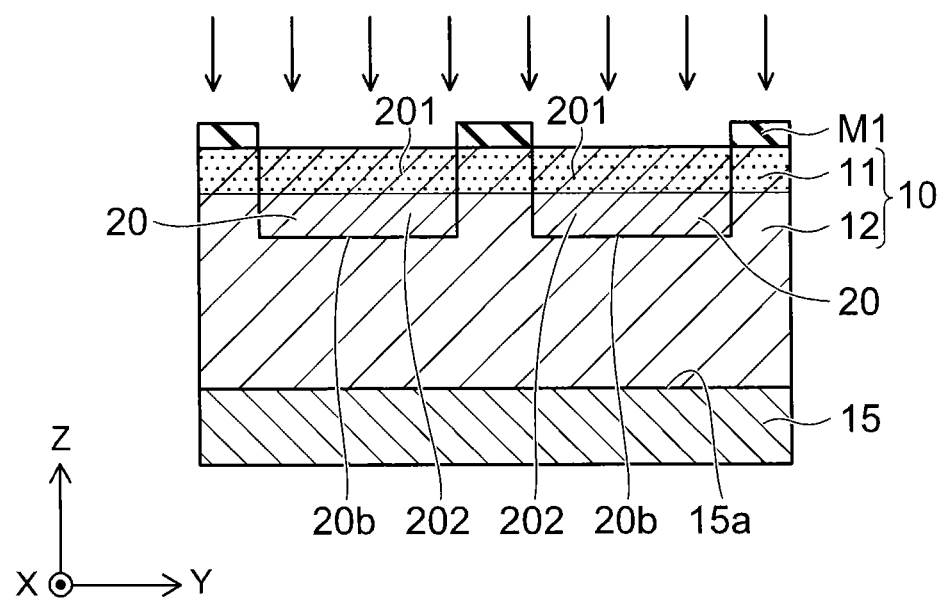

Next, as shown in FIG. 4B, a mask M1 is formed on the drift region 10. The mask M1 is provided with an opening at the position for forming the base region 20. Then, p-type impurity (e.g., Al) is ion implanted through this mask M1. The base region 20 is formed deeper than the first region 11. That is, the lower end 20b of the base region 20 is located below the first region 11.

The thickness of the base region 20 is e.g. 0.5 μm or more and 0.8 μm or less. The impurity concentration of the base region 20 is e.g. $1 \times 10^{17}$ cm$^{-3}$ or more and $5 \times 10^{18}$ cm$^{-3}$ or less. Here, p-type impurity (e.g., Al) is ion implanted into the first region 11 and the second region 12. The n-type impurity concentration of the first region 11 is higher than the n-type impurity concentration of the second region 12. Thus, in the first region 11, more p-type impurity (e.g., Al) is compensated than in the second region 12. Accordingly, the p-type impurity concentration of the base region 20 is increased from the region 201 of the base region 20 overlapping the first region 11 toward the region 202 of the base region 20 overlapping the second region 12. The p-type impurity concentration of the base region 20 is maximized in the portion of the lower end 20b of the base region 20.

Furthermore, the first region 11 is richer in C than the second region 12. That is, the concentration of vacancies of Si in the first region 11 is higher than the concentration of vacancies of Si in the second region 12. Thus, when p-type impurity (e.g., Al) is ion implanted into this first region 11, excess Al reacts with vacancies of Si. Accordingly, the density of interstitial impurity atoms due to excess Al is decreased. The decrease of interstitial impurity atoms in the channel region reduces Coulomb scattering factors decreasing the channel mobility, and hence suppresses characteristics degradation. Thus, in forming the base region 20, despite ion implantation with much p-type impurity (e.g., Al), the channel region is scarcely affected. Furthermore, the impurity concentration in the portion of the lower end 20b of the base region 20 is set to be high. After forming the base region 20, the mask M1 is removed.

Figure 5A:
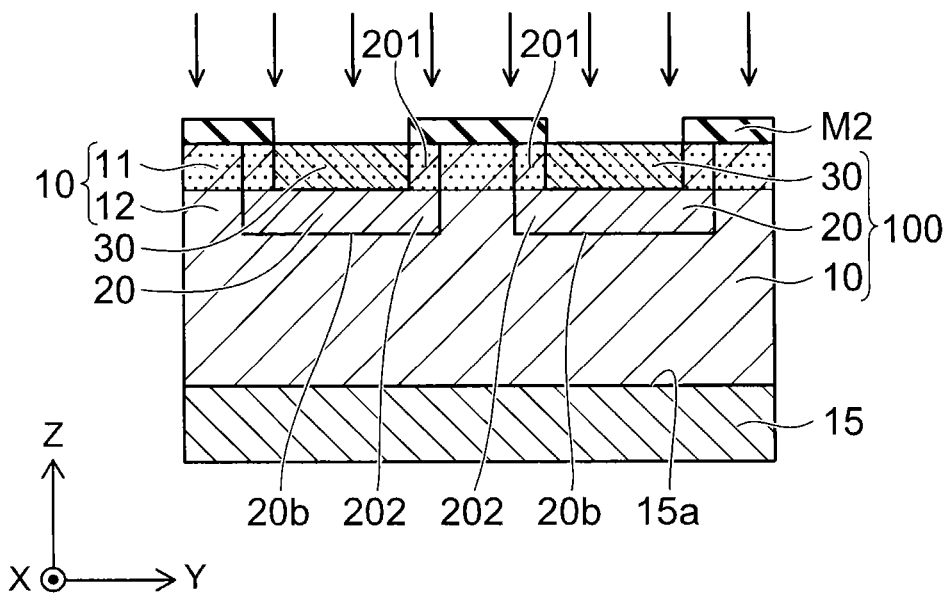

Next, as shown in FIG. 5A, a mask M2 is formed on the drift region 10 and the base region 20. The mask M2 is provided with an opening at the position for forming the source region 30. Then, n-type impurity (e.g., $N_2$) is ion implanted through this mask M2. The source region 30 is formed shallower than the base region 20.

The thickness of the source region 30 is e.g. 0.1 µm or more and 0.3 µm or less. Depending on the thickness of the base region 20, the thickness of the source region 30 is e.g. 0.1 µm or more and 0.5 µm or less. The impurity concentration of the source region 30 is e.g. $5 \times 10^{18}$ cm$^{-3}$ or more and $5 \times 10^{20}$ cm$^{-3}$ or less. By the formation of the source region 30, the structural body 100 is formed.

Figure 5B:
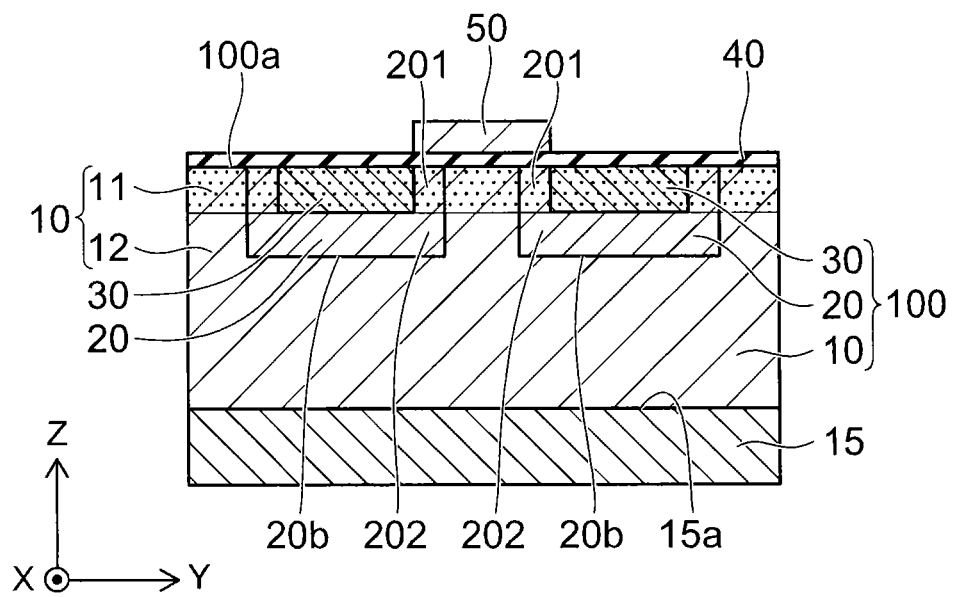

Next, as shown in FIG. 5B, a gate insulating film 40 is formed on the upper surface 100a of the structural body 100. The gate insulating film 40 is made of e.g. silicon oxide, silicon nitride, or high dielectric material (high-k material).

Next, a gate electrode 50 is formed on the gate insulating film 40. The gate electrode 50 is formed at least above the base region 20 via the gate insulating film 40. The gate electrode 50 is made of e.g. polycrystalline silicon or metal material (such as TiN, Al, Ru, W, and TaSiN). The gate electrode 50 is formed by forming this material on the entire surface of the upper side of the structural body 100, and then leaving only the necessary portion by patterning.

Figure 6A:
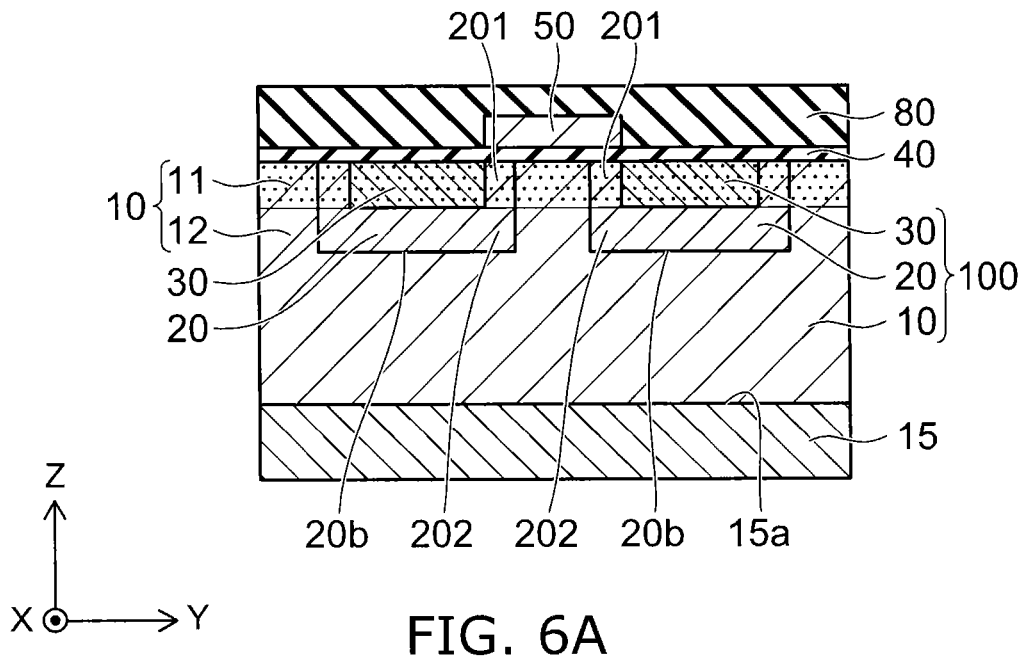

Next, as shown in FIG. 6A, an interlayer insulating film 80 is formed on the gate insulating film 40 and the gate electrode 50. The interlayer insulating film 80 is made of e.g. silicon oxide.

Figure 6B:
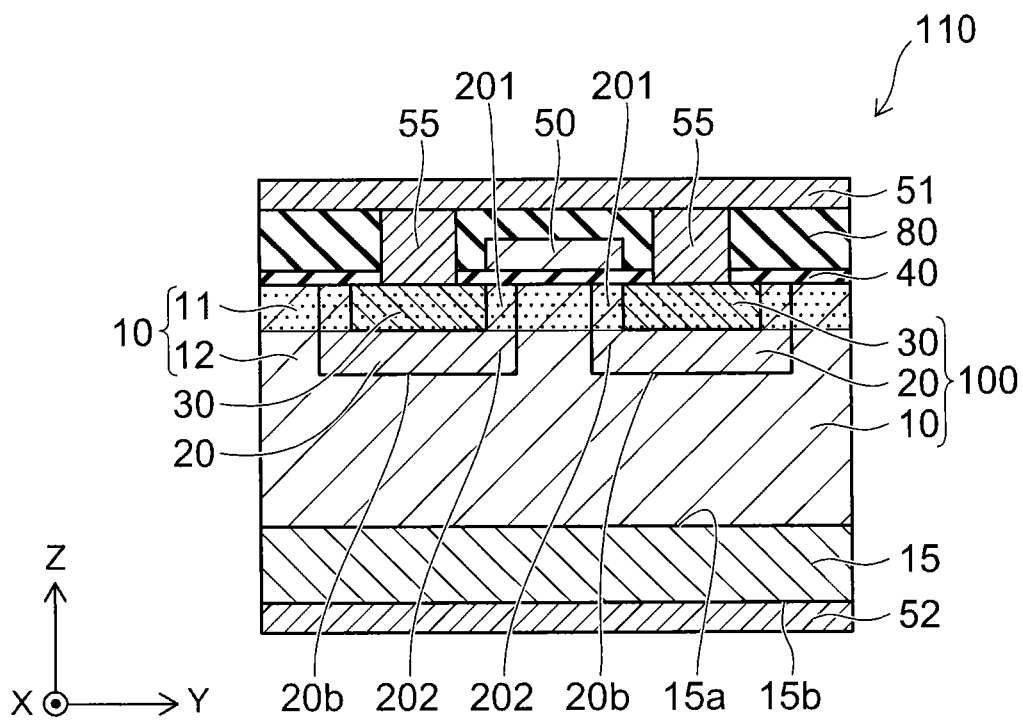

Next, as shown in FIG. 6B, a source electrode 51 and a drain electrode 52 are formed. More specifically, a contact 55 is embedded so as to penetrate in the Z direction through the interlayer insulating film 80 and the gate insulating film 40 above the source region 30. Then, a source electrode 51 in contact with the contact 55 is formed on the interlayer insulating film 80. On the other hand, a drain electrode 52 is formed in contact with the second surface 15b of the substrate 15. Thus, the transistor 110 is completed.

In the method for manufacturing the transistor 110 as described above, the first region 11 is provided in the drift region 10. This establishes the carrier concentration of the portion constituting a channel in forming the base region 20. That is, there is no need to perform counter ion implantation for adjusting the carrier concentration on the portion constituting a channel. Because the need of counter ion implantation is eliminated, there is no damage due to ion implantation into the portion constituting a channel.

Furthermore, in the ion implantation of impurity in forming the source region 30, the first region 11 has been formed. Thus, compared with the case where the first region 11 has not been formed, there is no need to increase the impurity concentration. This suppresses damage due to ion implantation.

The manufacturing method as described above suppresses the decrease of channel mobility while increasing the carrier concentration in the portion of the lower end 20b of the base region 20 to ensure the characteristics of high breakdown voltage. Thus, a transistor 110 having low on-resistance is manufactured.

As described above, the transistor and the method for manufacturing the same according to the embodiments can achieve improvement and stabilization of the characteristics.

The embodiments have been described above. However, the invention is not limited to these examples. For instance, those skilled in the art can modify the above embodiments by suitable addition, deletion, and design change of components, and by suitable combination of the features of the embodiments. Such modifications are also encompassed within the scope of the invention as long as they fall within the spirit of the invention.

For instance, in the description of the above embodiments, the first conductivity type is n-type, and the second conductivity type is p-type. However, the invention is also practicable when the first conductivity type is p-type and the second conductivity type is n-type.

In the above embodiments, the structure of the gate electrode 50 is described by taking the planar type as an example. However, the embodiments are also applicable to a transistor including a gate electrode 50 of the trench type.

In the description of the above embodiments, SiC is used as an example of the compound semiconductor. However, gallium nitride (GaN) may also be used as the compound semiconductor.

Furthermore, in the description of the above embodiments, a MOSFET is taken as an example of the transistor 110. However, the invention is also applicable to IGBT (insulated gate bipolar transistor) and IEGT (injection enhanced gate transistor).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A transistor comprising:
   a structural body including a first semiconductor region of a first conductivity type, a second semiconductor region of a second conductivity type provided on the first semiconductor region, and a third semiconductor region of the first conductivity type provided on the second semiconductor region, the structural body including a compound semiconductor having a first element and a second element;
   an insulating film provided on the second semiconductor region;
   a control electrode provided on the insulating film;
   a first electrode electrically continuous with the third semiconductor region; and
   a second electrode electrically continuous with the first semiconductor region,
   the structural body having a first region provided above a lower end of the second semiconductor region and a second region other than the first region, the first region being a region formed by making a ratio of concentration of source gas of the second element to concentration of source gas of the first element larger than 1.0, and
   impurity concentration of the first conductivity type in the first region being higher than impurity concentration of the first conductivity type in the second region,
   wherein
   the second region is a region formed by setting the ratio to 1.0, and
   the first region is a region formed by setting the ratio to larger than 1.0 and 2.0 or less.

2. The transistor according to claim 1, wherein vacancy of the first element is more likely to react with impurity of the second conductivity type than vacancy of the second element.

3. The transistor according to claim 1, wherein the first semiconductor region is a region formed by epitaxial growth.

4. The transistor according to claim 1, wherein the first region is a region formed continuously from the second region by epitaxial growth.

5. The transistor according to claim 1, wherein impurity concentration of the second semiconductor region increases from an upper end to the lower end.

6. The transistor according to claim 1, wherein the compound semiconductor is silicon carbide.

7. The transistor according to claim 6, wherein the first element is silicon, and the second element is carbon.

8. The transistor according to claim 1, wherein surface on the insulating film side of the structural body is a (000-1) surface of silicon carbide.

9. The transistor according to claim 1, wherein thickness of the first region is half or less of depth of the second semiconductor region.

10. The transistor according to claim 1, wherein thickness of the first region is thicker than thickness of step bunching occurring in epitaxial growth of the first semiconductor region.

11. The transistor according to claim 1, wherein thickness of the first region is 0.5 micrometers or less.

12. A transistor comprising:
a structural body including a first semiconductor region of a first conductivity type, a second semiconductor region of a second conductivity type provided on the first semiconductor region, and a third semiconductor region of the first conductivity type provided on the second semiconductor region, the structural body including a compound semiconductor having a first element and a second element;
an insulating film provided on the second semiconductor region;
a control electrode provided on the insulating film;
a first electrode electrically continuous with the third semiconductor region; and
a second electrode electrically continuous with the first semiconductor region,
the structural body having a first region provided above a lower end of the second semiconductor region and a second region other than the first region,
a concentration of vacancies of the second element in the first region being lower than a concentration of vacancies of the second element in the second region,
impurity concentration of the first conductivity type in the first region being higher than impurity concentration of the first conductivity type in the second region.

13. A transistor comprising:
a structural body including a first semiconductor region of a first conductivity type, a second semiconductor region of a second conductivity type provided on the first semiconductor region, and a third semiconductor region of the first conductivity type provided on the second semiconductor region, the structural body including a compound semiconductor having a first element and a second element;
an insulating film provided on the second semiconductor region;
a control electrode provided on the insulating film;
a first electrode electrically continuous with the third semiconductor region; and
a second electrode electrically continuous with the first semiconductor region,
the structural body having a first region provided above a lower end of the second semiconductor region and a second region other than the first region,
a concentration of vacancies of the first element in the first region being higher than a concentration of the vacancies of the first element in the second region,
impurity concentration of the first conductivity type in the first region being higher than impurity concentration of the first conductivity type in the second region.

* * * * *